United States Patent
Tseng

[11] Patent Number: 5,728,618
[45] Date of Patent: Mar. 17, 1998

[54] METHOD TO FABRICATE LARGE CAPACITANCE CAPACITOR IN A SEMICONDUCTOR CIRCUIT

[75] Inventor: Horng-Huei Tseng, Hsinchu, Taiwan

[73] Assignee: Vanguard International Semiconductor Corporation, Hsin-Chu, Taiwan

[21] Appl. No.: 868,603

[22] Filed: Jun. 4, 1997

[51] Int. Cl.[6] .............................................. H01L 21/8242
[52] U.S. Cl. ........................................ 438/253; 438/254
[58] Field of Search ................................. 438/238–241, 438/254–256, 381, 396–397, 250, 393

[56] References Cited

U.S. PATENT DOCUMENTS

| | | | |
|---|---|---|---|
| 5,126,280 | 6/1992 | Chan et al. | 437/52 |
| 5,389,568 | 2/1995 | Yun | 437/60 |
| 5,405,796 | 4/1995 | Jones, Jr. | 438/253 |
| 5,468,670 | 11/1995 | Ryou | 438/254 |
| 5,478,769 | 12/1995 | Lim | 438/253 |

*Primary Examiner*—Jey Tsai
*Attorney, Agent, or Firm*—George O. Saile; Stephen B. Ackerman; William J. Stoffel

[57] ABSTRACT

A high capacitance stacked capacitor is defined using one optical mask for two masking steps where one masking step includes overexposing the resist layer. The method begins by forming a planarizing layer 28 over the substrate surface. A first photolithographic process using a first optical mask is used to form a first opening in the planarizing layer 28. A polysilicon stud 38 is formed in the first opening. A dielectric layer 40 is formed over the planarizing layer 28. A second opening 44 is formed in the dielectric layer 40 using a second photolithographic process using the same first optical mask. The second photoresist layer is exposed at a higher energy than the exposure of the first photoresist layer. The dielectric layer 40 is etched using the second photoresist pattern as an etch mask and forming the second opening 44 in the dielectric layer 40. Because of the overexposure, the second opening 44 has a larger open dimension than the first opening 36. A second polysilicon layer 50 is formed over the dielectric layer 40, over the sidewalls of the dielectric layer 40, and over the polysilicon stud 38 thus forming a cylindrical electrode 50A. The polysilicon plug 38 and the cylindrical electrode 50A comprise the bottom electrode 38 50A of the capacitor of the invention.

14 Claims, 4 Drawing Sheets

METHOD TO FABRICATE LARGE CAPACITANCE CAPACITOR IN A SEMICONDUCTOR CIRCUIT

BACKGROUND OF THE INVENTION

1) Field of the Invention

The present invention relates to structures and methods of fabricating a dynamic random access memory having a high capacitance stacked capacitor.

2) Description of the Prior Art

Semiconductor device manufactures are continually pressured to increase effective device densities in order to remain cost competitive. As a result, Very Large Scale Integration (VLSI) and Ultra Large Scale Integration (ULSI) technologies have entered the submicron realm of structural dimension and now are approaching physical limits in the nanometer feature size range. In the near future, absolute atomic physical limits will be reached in the conventional two-dimensional approach to semiconductor device design. Traditionally, dynamic random access memory (DRAM) designers have faced the severest of challenges in advancing technologies. For example, designers of 64K DRAMs were perplexed to learn that a practical physical limit to charge capacity of storage capacitors had already been reached due to the minimum charge necessary to sense signals in the presence of environmental or particulate radiation inherently present in fabrication materials. Storage capacitors in the range of 50 femtofarads are now considered to be a physical limit. From a practical view, this limitation prevented the scaling of DRAM capacitors. Reduction of the surface area of a semiconductor substrate utilized by the storage capacitor has also been severely restricted. Large DRAM devices are normally silicon based, and each cell typically embodies a single MOS field effect transistor with its source connected to a storage capacitor. This large integration of DRAMs has been accomplished by a reduction in individual cell size. However, a decrease in storage capacitance, which results from the reduction in cell size, leads to draw backs, such as a lowering source/drain ratio and undesirable signal problems in terms of reliability.

Due to decreases in the thickness of capacitor materials, existing 1 Megabit (1 MBit) DRAM technologies utilize a planar device in circuit design. Beginning with 4 MBit DRAMs, the world of three-dimensional design has been explored to the extent that the simple single device/capacitor memory cell has been altered to provide the capacitor in a vertical dimension. In such designs the capacitor has been formed in a trench in the surface of the semiconductor substrate. In yet denser designs, other forms of capacitor design are proposed, such as stacking the capacitor above the transfer device.

There are two main approaches in producing capacitors for DRAM's, some manufacturers pursuing trench capacitors built into the crystalline silicon wafer, and other manufacturers pursuing stacked capacitors in which the capacitor is fabricated on top of the wafer surface. In the case of the trench capacitor, its extendibility is in doubt since it is extremely difficult to etch about 0.15–0.25 micrometer wide trenches well over 10 micrometers deep, as well as to then fabricate ultra thin dielectric layers on the trench surface, fill the trench, etc. On the other hand, the use of a stacked capacitor permits a variety of new process options, for example, in the choice of electrode material (polysilicon, silicide, etc.).

A stacked capacitor is fabricated by forming the stacked capacitor structures laying over the gate electrode on active, field oxide, and diffusion regions. The processing of such structures has become very complicated and require lithography and etching steps that are not in step with the very small dimensions required in the present and future state of the art. Although there has been much work done in accomplishing these small size devices and increased capacitance therein, there is still great need for devices with even greater capacitance for a given space in order to achieve even greater packing densities and improve the DRAM products of the future.

Efforts to maintain or increase the storage capacitance in memory cells with greater packing densities is evident in U.S. Pat. No. 5,126,280 (Chan et al.) which shows stacked multi-poly spacers with a double cell plate capacitor. Also, U.S. Pat. No. 5,389,568 (Yun) discloses a capacitor having an outer peripheral wall portion with a laterally extending bottom on an insulating layer, and an inner central pillar portion including a hole.

However, a need continues to exist in the art for an easy to manufacture stacked capacitor having a larger surface area so that the capacitor's capacitance is increased in high density DRAM, without increasing the area occupied by the capacitor structure and without increasing the process complexity.

SUMMARY OF THE INVENTION

It is an object of this invention to provide a process and structure for easily producing a memory cell with a greater capacitance per unit area.

It is an object of this invention to provide a structure and an improved process for producing a memory cell with a greater capacitance per unit area for use in a high density DRAM, without increasing the area occupied by the capacitor structure on or in a silicon substrate and without increasing the processing complexity.

It is an object of this invention to provide a structure and an improved process a capacitor with high capacitance that defines an upper cylindrical by overexposing the node contact mask.

A structure and a process for fabricating an improved dynamic random access memory device having a high capacitance stacked capacitor is provided. The method begins by:

selectively forming field oxide regions 12 on the surface of a semiconductor substrate thereby defining device areas for fabrication of field effect devices;

forming a gate dielectric layer 14 on the substrate in the device area;

depositing a first polysilicon layer on the field oxide regions 12 and the device area;

depositing a top gate insulating layer 18 on the first polysilicon layer;

removing portions of the gate dielectric layer 18, first polysilicon layer and top gate insulating layer while leaving portions thereof forming a gate structure 14 16 18 in the device area, and forming interconnection lines 14 16 18 over portions of the field oxide regions 12, the portions of the gate dielectric layer 14, first polysilicon layer 16 and top gate insulating layer 18 having substantially vertical sidewalls;

forming lightly doped source/drain structures 20A 20B in the device area associated with the gate structure;

forming sidewall spacers 22 on the sidewalls of the gate dielectric layer 14, first polysilicon layer 16 and top gate insulating layer 28;

forming source and drain regions 24A 24B within the device area of the semiconductor substrate associated with the gate structure;

forming a first insulating layer 26 over the device area and field oxide area;

forming a planarizing layer 28 over the first insulating layer 26;

using a first photolithographic process to form a first opening 36 in the first insulating layer 26 and the planarizing layer 28 and exposing the source region 24A; the first photolithographic process comprising forming a first photoresist layer over the first insulating layer 26; exposing the first photoresist layer using a first optical mask 46 having a first optical opening 46A, developing the first photoresist layer forming a first photoresist pattern having a first photoresist opening; etching the first insulating layer 26 using the first photoresist pattern as an etch mask and forming the first opening in the first insulating layer exposing the source region 24A;

depositing a first polysilicon layer; the first polysilicon layer filling the first opening and contacting the source region 24A;

planarizing the first polysilicon layer forming a polysilicon stud 38 in the first opening; the planarization performed using chemical-mechanical polishing and etching back process;

forming a dielectric layer 40 over the planarizing layer 28;

forming a second opening 44 in the dielectric layer 40 using a photolithographic process using the first optical mask; the photolithographic process comprising forming a second photoresist layer over the dielectric layer 40; exposing the second photoresist layer using the first optical mask 46, the exposure of the second photoresist layer 45 having a higher energy than the exposure of the first photoresist layer; developing the second photoresist layer 45 and forming a second photoresist pattern having an second photoresist opening 45A; etching the dielectric layer 40 using the second photoresist pattern as an etch mask and forming the second opening 44 in the dielectric layer 40 exposing the polysilicon stud 38; the second opening defined by the sidewalls of the dielectric layer 40; the second opening 44 having a larger open dimension than the first opening 36;

forming a second polysilicon layer 50 over the dielectric layer 40, over the sidewalls of the dielectric layer 40, and over the polysilicon stud 38; the second polysilicon layer 50 defining a gap 54 in the second opening 44;

chemical-mechanical polishing the second polysilicon layer 50 forming a cylindrical electrode 50A; the polysilicon plug 38 and the cylindrical electrode 50A forming a bottom electrode 38 50A:, selectively removing the dielectric layer 40;

forming a capacitor dielectric layer 60 and a top electrode 64 over the bottom electrode 38 50 to form the high capacitance capacitor of the invention.

The invention forms a capacitor that has a high capacitance using the following important process steps. First, the cylindrical electrode 50A is defined using the same optical mask 46 used to form the node contact opening 36 (first opening). The photoresist is overexposed thereby forming a slightly larger cylindrical electrode opening 44 than the node contact opening 36. Second, a thin 2nd polysilicon layer 50 is used to form the cylindrical electrode 50A and forming a gap 54 in the center of the cylindrical electrode. The gap 54 increases the capacitance of the capacitor.

This invention provides a stacked capacitor with greater capacitance per unit area by using a mask overexposure technique to accurately define the cylindrical portion of the bottom electrode. The method of defining the upper cylinder 50a using the first contact node mask (1st optical mask) allows precise control over the dimensions (width and length/diameter) of the cylinder 50A. Also, the thickness of the second polysilicon layer is very controllable. Together, the overexposure masking technique and the thin polysilicon layer of the invention precisely control the dimensions of the cylinder and allow increase miniaturization and capacitance.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A structure and a process for fabricating an improved dynamic random access memory device having a high capacitance cylindrical stacked capacitor is provided by the invention as shown in FIGS. 1 through 6 and described below.

Figure 1:
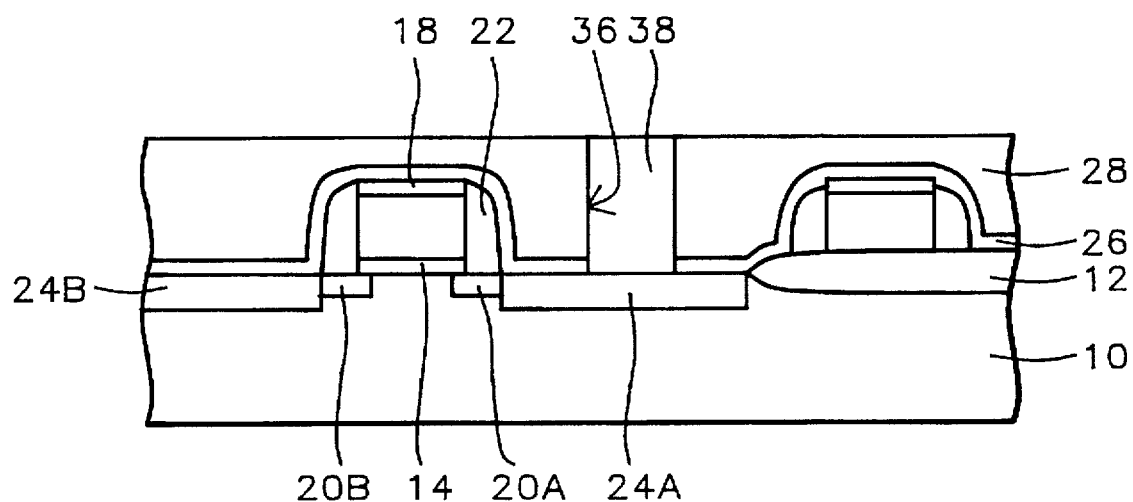
FIGS. 1, 2A–2B and 3–6 are schematic cross-sectional representations of a structure and a method for fabricating a stacked capacitor in combination with a field effect device which is usable in a memory cell.

As shown in FIG. 1, the method begins by selectively forming field oxide regions 12 on the surface of a semiconductor substrate thus defining device areas (e.g., active areas or non-field oxide areas) for fabrication of field effect devices.

The first series of steps involve the formation of the dielectric isolation regions 12 for isolating semiconductor surface regions from other such regions in the semiconductor substrate 10. The semiconductor substrate 10 is preferably composed of silicon having a <100> crystallographic orientation. In an effort to simplify the description and the drawings the dielectric isolation between devices has been only partially shown and will not be described in detail because they are conventional. For example, one method is described by E. Kooi in his U.S. Pat. No. 3,970,486 wherein certain selected surface portions of a silicon semiconductor substrate are masked against oxidation, and then the exposed unmasked surface is oxidized to grow a thermal oxide which in effect sinks into the silicon surface at the unmasked areas. The masked silicon remains as a mesa surrounded by the sunken silicon dioxide or field oxide pattern, FOX 12. Then semiconductor devices can be provided in the silicon mesas (i.e., device areas) according to the following processes.

The surface of the silicon substrate 10 is thermally oxidized to form the desired gate dielectric layer 14 thickness. A preferred thickness is between about 80 to 200 Angstroms.

A first polysilicon layer 16 is then blanket deposited by a LPCVD (Low Pressure Chemical Vapor Deposition) method. The preferred thickness of the first polysilicon layer 16 is between about 1000 to 3000 Angstroms. The first polysilicon layer 16 is ion implanted with phosphorous or arsenic ions under the conditions of a dose between about 5E15 and 10E15 dosage per area and at an energy between about 20 and 60 Kev. In an alternative, the first polysilicon layer 16 can be doped with phosphorus oxychloride at a temperature of about 900 C.°. The first polysilicon layer can also comprise a two layer structure of a bottom doped polysilicon layer and a top silicide layer.

A top gate insulating layer 18 composed of silicon dioxide or a glass layer 18 is then formed on the polysilicon layer 16. The layers 14, 16, and 18 are patterned by conventional lithography and anisotropic etching techniques as are well known in the art to provide a desired pattern of gate electrodes 14 16 18 and interconnection lines (e.g., word lines, runners) on the FOX 12 surfaces or elsewhere as seen in FIG. 1. The portions of the gate dielectric layer 14, first polysilicon layer 16 and top gate insulating layer 18 have substantially vertical sidewalls.

The source/drain structure 20A/20B (LLD) & 23A/24B (S/D) of the metal oxide semiconductor field effect transistor (MOS FET) may now be formed by the following steps. FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a complementary MOS (CMOS) FET could in a similar way be formed by making both N channel and P channel devices upon the same substrate. As is understood in the art, the dynamic random access memory (DRAM) cell is composed of a combination device structure of an N channel FET and a stacked capacitor while the peripheral circuits are often composed of CMOS devices. FIG. 1, for example, shows the ion implantations of N– dopants. Lithographic photoresist masks may be required to protect the areas not to be subjected to that particular N– ion implantation. The formations of the lithographic photoresist masks are done by conventional lithography and etching techniques. The N– lightly doped drain implantation 20 can be performed with, for example phosphorous P31 at a dose of between about 1E13 to 1E14 atoms/cm$^2$ and with an energy of between about 20 to 40 Kev. Thereby forming lightly doped source/drain structures 20A 20B in the device area associated with the gate structure.

Sidewall spacers 22 are now formed on the sidewalls of the gate dielectric layer 14, first polysilicon layer 16 and top gate insulating layer 28. A low temperature silicon oxide deposition is preferred, such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 22 is between about 1000 to 2500 Angstroms.

An anisotropic etching of this layer produces the dielectric sidewall spacer layer 22 on the sidewalls of the wordline and layer structures 14, 16, 18. The preferred anisotropic etching uses a conventional reactive ion etching ambient.

Next, source and drain regions 24A 24B are formed within the device area of the semiconductor substrate associated with the gate structure. The N+ source/drain ion implantation preferably uses Arsenic, (As$_{75}$) with a dose of between about 2E15 to 1E16 atoms/cm$^2$ and energy of between about 20 to 70 Kev to complete the source/drain regions 24 of the N channel lightly doped drain MOS FET integrated circuits device as seen in the FIG. 1.

A first insulating layer 26 is preferably then formed over the device area and field oxide area. The first insulating layer 26 is preferably composed of undoped silicon oxide and preferably has a thickness in a range of between about 1000 and 2000 Å.

Next, a dielectric planarizing layer 28 is formed over the first insulating layer 26. The planarizing layer 28 is preferably formed of LPCVD or PECVD undoped oxide, or borophosphosilicate glass and is more preferably formed of undoped oxides and preferably has a thickness in a range of between about 3000 and 8000 Å.

A first opening (e.g., node contact opening) 36 is formed in the first insulating layer 26 and the planarizing layer 28 that exposes the source region 24A. An important point is that the same optical mask 46 is used to define the first opening 36 and the subsequent second opening (cylinder opening) 44. See FIGS. 1 and 2A. The first opening 36 is formed using a first photolithographic process using a first optical mask 46 having first optical openings 46A. The first photolithographic process comprises: forming a first photoresist layer (not shown) over the first insulating layer 26; exposing the first photoresist layer using the first optical mask; developing the first photoresist layer forming a first photoresist pattern having an first photoresist openings; etching the first insulating layer 26 using the first photoresist pattern as an etch mask and forming the first opening in the first insulating layer exposing the source region 24A.

Subsequently, a first polysilicon layer is formed over the planarizing layer 28. The first thin polysilicon layer fills the first opening 36 and contacts the source region 24A. The first polysilicon layer preferably has a thickness in a range of between about 1000 and 4000 Å. The preferred deposition process is in-situ phosphorus doped wherein the temperature is 570° C., the gas is the mixed gas of 15% PH$_3$ and 85% silane, and 5% PH$_3$ and 95% nitrogen. The mixed gas, of 5% PH$_3$ and 95% nitrogen, plays the role of fine-tuning of the dopant concentration between wafers. Alternatively, the layer 30 could be a combination of in-situ doped polysilicon and undoped polysilicon with the former beneath. The undoped polysilicon is formed by a LPCVD process where the reaction gas is silane, the temperature is about 620° C., and the pressure is about 300 mTorr.

Next, the first polysilicon layer is planarized forming a polysilicon stud 38 in the first opening. The planarization is preferably performed using a chemical-mechanical polishing or plasma etch back process.

Figure 2A:
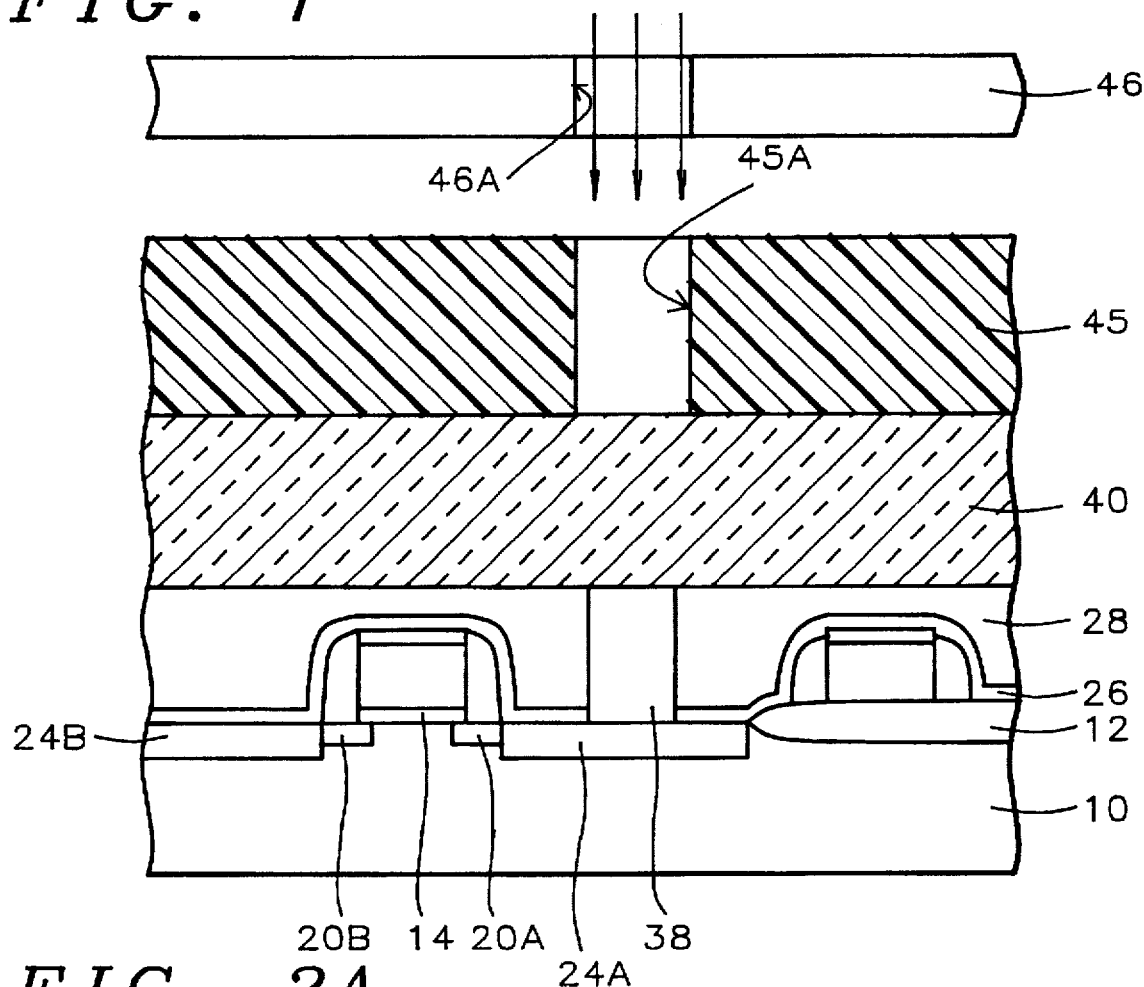

As shown in FIG. 2A, a dielectric layer 40 is formed over the planarizing layer 28. The dielectric layer has a thickness in a range of between about 3000 and 8000 Å. The dielectric layer 70 is preferably composed of a doped oxide such as, phosphosilicate glass, borosilicate glass (BSG), doped spin-on-glass (SOG), porous oxide formed by thermal O$_3$-TEOS (thCVD), or borophosphosilicate glass and is most preferably formed of borophosphosilicate glass.

Figure 2B:
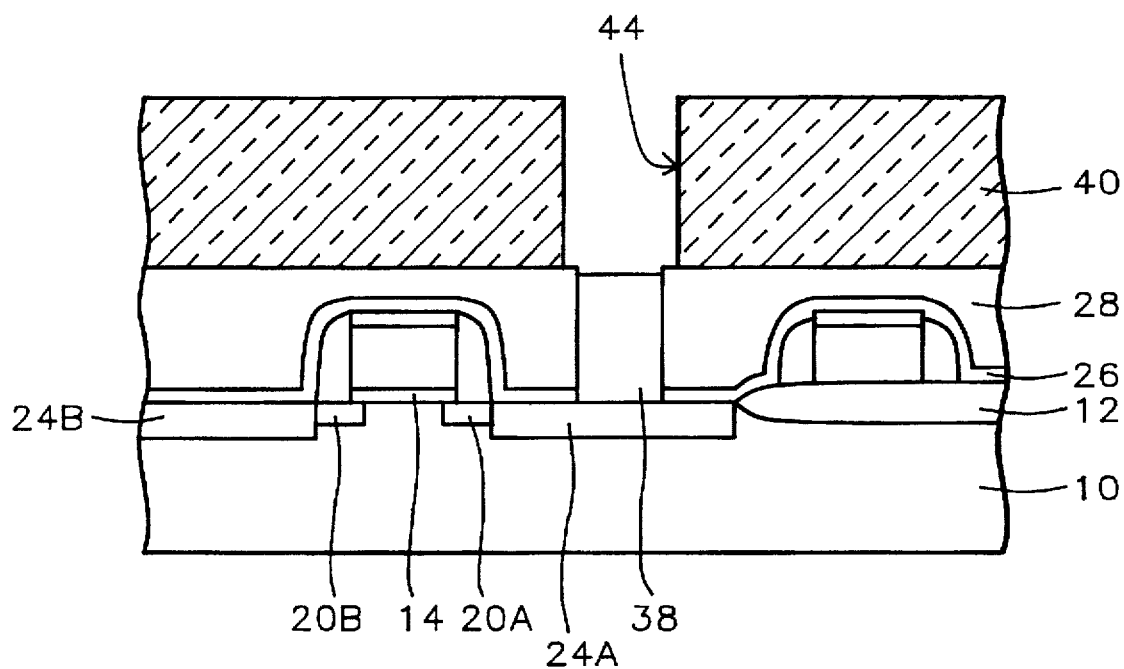

Referring to FIG. 2B, a second opening 44 is formed in the dielectric layer 40 using a second photolithographic process using the first optical mask 46. It is important to understand that the second photo process uses the same first optical mask 46 used the to define the first opening 36. However, an overexpose process is used to enlarge the second photoresist opening 45A and the second opening 44 as shown in FIGS. 2A & 2B. The second photolithographic process comprises forming a second photoresist layer 45 over the dielectric layer 40. The second photoresist layer 45 can be positive or negative photoresist and is more preferably positive photoresist.

As shown in FIG. 2A, the second photoresist layer 46 is exposed using the first optical mask 46. Light shines through the opening 46A in the first optical mask 46 onto the second photoresist layer 40. The exposure of the second photoresist layer has a higher energy than the exposure of the first photoresist layer thereby enlarging the second photoresist opening 45A and second opening 44.

The second photoresist layer 45 is developed forming a second photoresist pattern having a second photoresist opening 45A. The second opening can have any shape including circular, square, rectangular.

As shown in FIG. 2B, the dielectric layer 40 is etched using the second photoresist pattern (second photoresist opening 45A) as an etch mask and forming the second opening 44 in the dielectric layer 40 exposing the polysilicon stud 38. The etch is preferably an anisotropic RIE etch such as a reactive ion etching with a fluorine gas such as $CHF_3$ or $CF_4+H_2$ (carbon tetrafluoride and hydrogen). The advantage of using the invention's photo overexpose step compared to an over etch step is that the overexposure step provide better control and more accurate dimensions.

The second opening 44 is defined by the sidewalls of the dielectric layer 40; the second opening 44 and has a larger open dimension than the first opening 36. The photoresist layer 45 is then removed.

Figure 3:
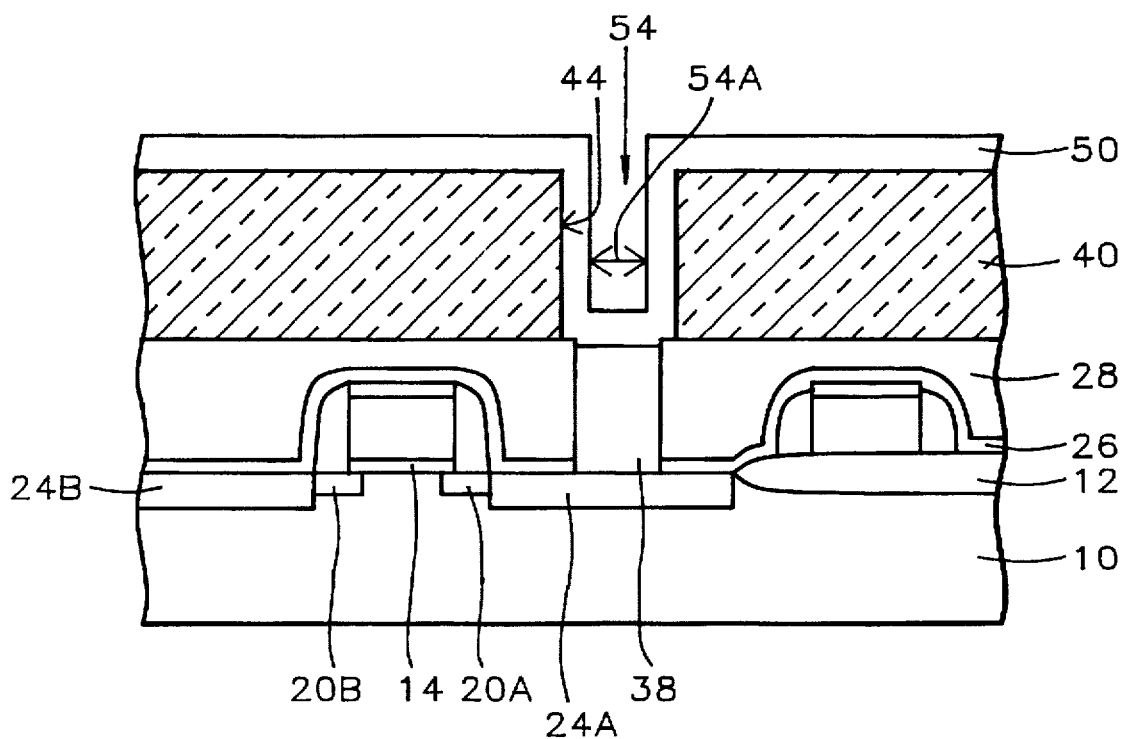

As shown in FIG. 3, a second polysilicon layer 50 is now formed over the dielectric layer 40, over the sidewalls of the dielectric layer 40 and over the polysilicon stud 38. The second polysilicon layer 50 defines a gap 54 in the second opening 44. The second polysilicon layer 50 preferably has a thickness in a range of between about 500 and 1500 Å.

The second polysilicon layer 50 is preferable deposited in an in-situ phosphorus doped process wherein the temperature is 570° C., the gas is a mixed gas of 15% $PH_3$ and 85% silane, and 5% $PH_3$ and 95% nitrogen. The mixed gas, 5% $PH_3$ and 95% nitrogen, plays the role of fine-tuning of the dopant concentration between wafers. Alternatively, the layer 50 could be a combination of in-situ doped polysilicon and undoped polysilicon with the former beneath. The undoped polysilicon is formed by LPCVD, the reaction gas is silane, the temperature is about 620° C., and pressure is about 300 mTorr.

Figure 4:
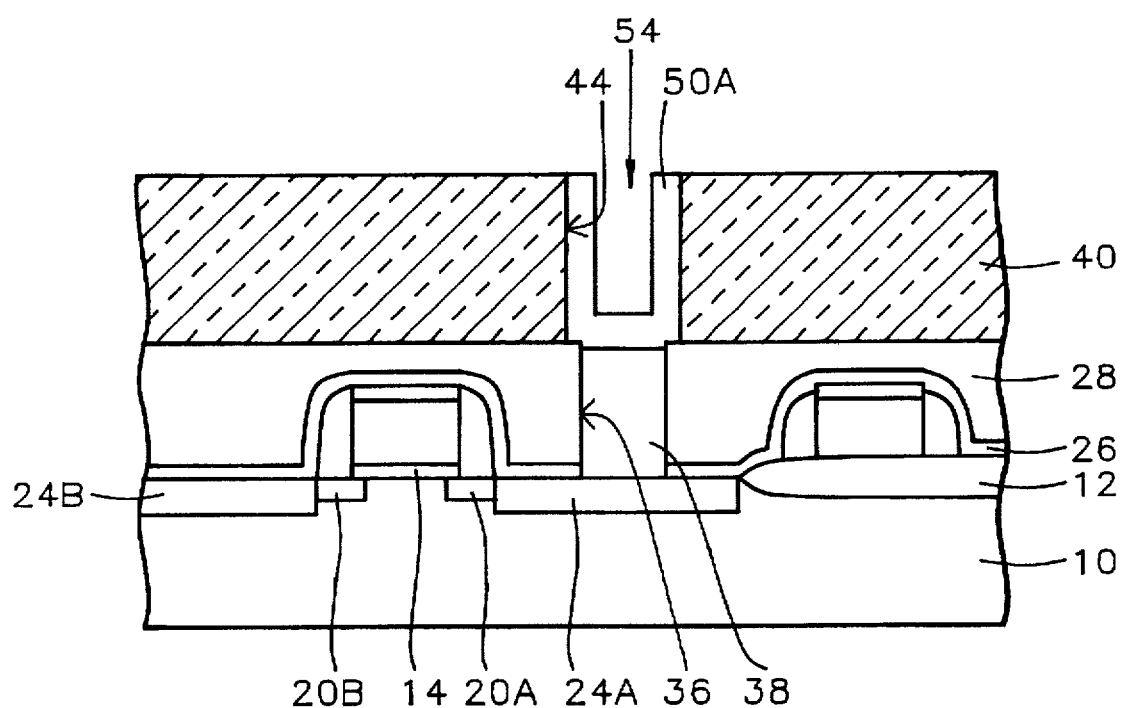

Referring to FIG. 4, the second polysilicon layer 50 is preferably chemical-mechanical polished thereby forming a cylindrical electrode 50A. Together, the polysilicon plug 38 and the cylindrical electrode 50A form the bottom electrode 38 50A of the invention.

Figure 5:
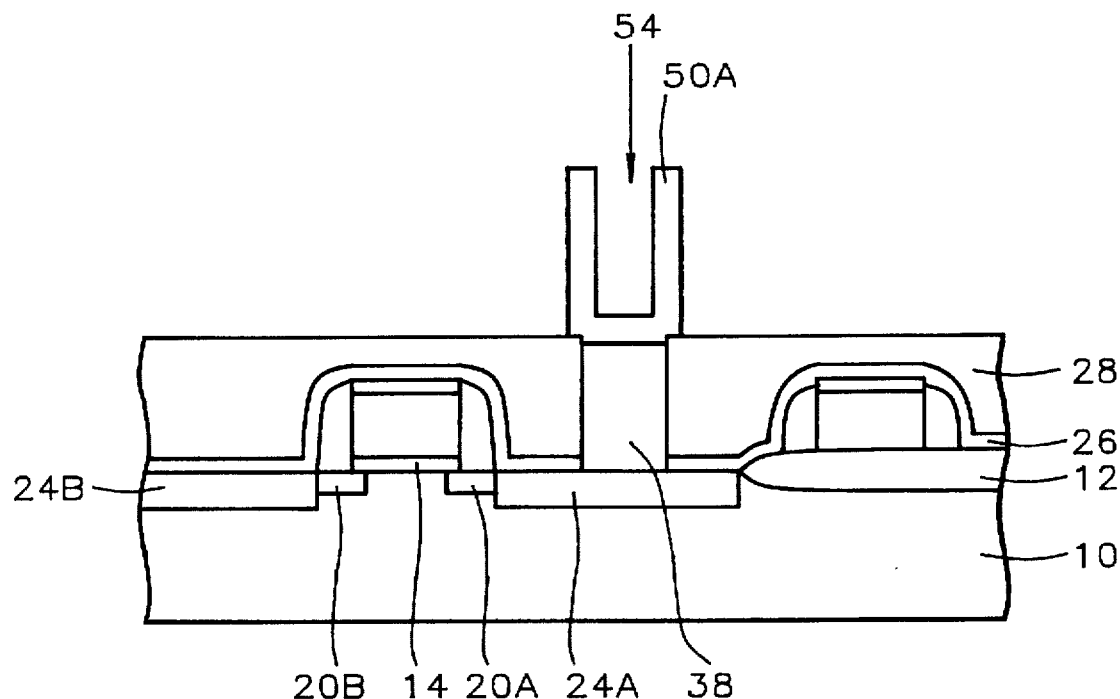

As shown in FIG. 5, the dielectric layer 40 is selectively removed. The dielectric layer (e.g., doped oxide) 40 is selectively removed using an etch that is selective to the dielectric layer (e.g., doped oxide layer) 40 and does not significantly etch the planarizing layer 28 (e.g., undoped oxide.). A suitable etch is a HF etch. The dielectric layer 40 is selectively etched over the underlying (undoped oxide) layer 28.

Figure 6:
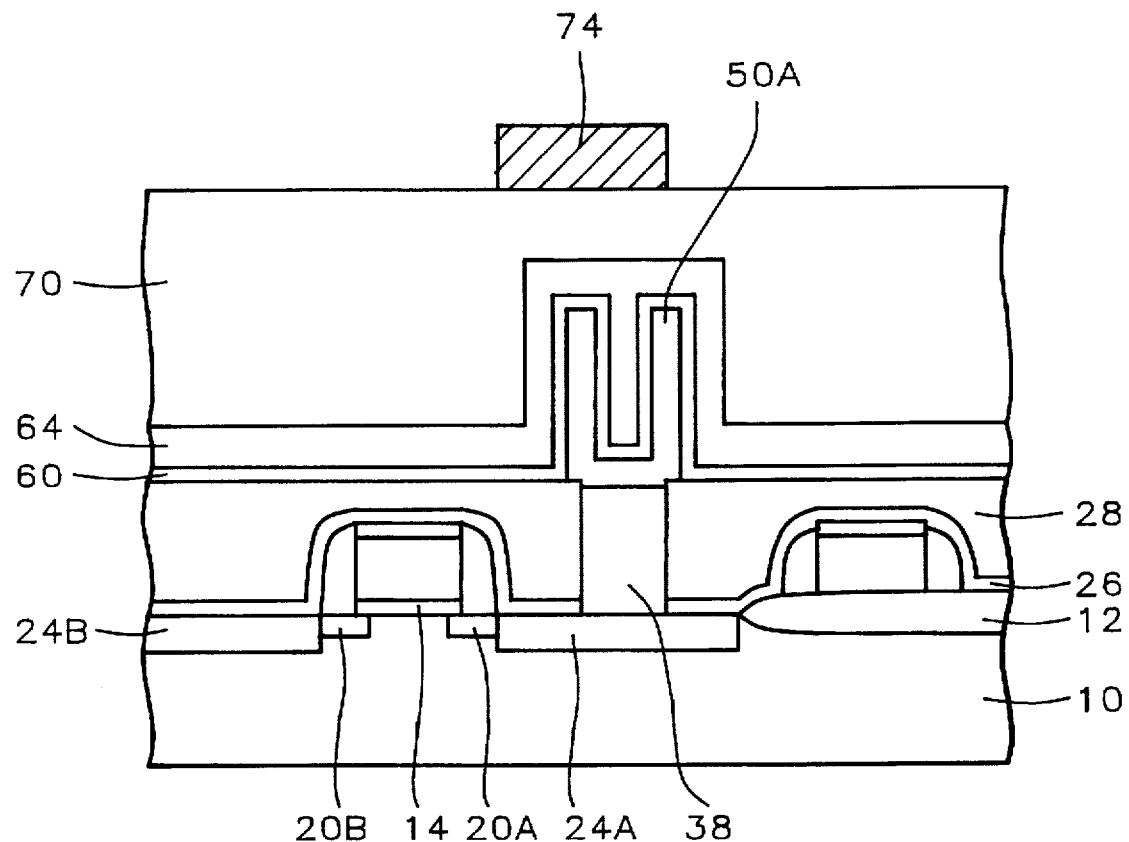

As shown in FIG. 6, a capacitor dielectric layer 60 and a top electrode 64 are formed over the bottom electrode 38 50A to form the high capacitance capacitor of the invention. The capacitor dielectric layer 60 can be formed of a dielectric, such as ONO (oxide/nitride/oxide) or $Ta_2O_5$. The capacitor dielectric 60 layer formed of a top silicon oxide, a silicon nitride and bottom silicon oxide (ONO) has a thickness for each layer in the range between about 30 to 90 Å. The top electrode 64 is formed of a conductive material, such as polysilicon and preferably has a thickness in a range of between about 1000 and 2000 Å.

Passivation layer 70 is formed over the capacitor 50A 38 60 64 and underlying layers. Next, the desired contact metallurgy 74 is deposited and patterned as is known in the art. Higher levels of metallurgy (not shown) and passivation can be formed over the metal layer 74 to complete the FET and DRAM devices. For example, a higher level of metallurgy contact to the top capacitor electrode (not shown) is necessary. The process is continued as understood by those skilled in the art to form the required interconnection metallurgy and passivation to complete the integrated circuit of the invention. This invention provides a stacked capacitor with greater capacitance per unit area without using extra masking steps.

This invention provides a stacked capacitor with greater capacitance per unit area using a mask overexposure technique to accurately define the cylindrical portion of the bottom electrode. The method of defining the upper cylinder 50a using the first contact node mask (1st optical mask) allows precise control over the dimensions (width and length/diameter) of the cylinder 50A. Also, the thickness of the second polysilicon layer 50 is very controllable. Together, the overexposure masking technique and the thin polysilicon layer of the invention precisely control the dimensions of the cylinder and allow increase miniaturization and capacitance.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a dynamic random access memory device having a high capacitance stacked capacitor comprising:

forming a planarizing layer over a substrate having a source region;

forming a first opening in said planarizing layer using a first photolithographic process; said first opening exposing said source region; said first opening formed using a first photolithographic process using a first optical mask having first optical openings;

forming a polysilicon stud in said first opening;

forming a dielectric layer over said planarizing layer;

forming a second opening in said dielectric layer using a second photolithographic process using said first optical mask;

forming a cylindrical electrode in said second opening; said polysilicon stud and said cylindrical electrode-forming a bottom electrode;

selectively removing said dielectric layer;

depositing a capacitor dielectric layer over said cylindrical electrode;

patterning said capacitor dielectric layer so that portions remain covering at least the cylindrical electrode; and forming a top electrode over said capacitor dielectric layer.

2. The method of claim 1 which further includes forming passivation layers, metal lines, and contacts to complete the dynamic random access memory device.

3. The method of claim 1 wherein said first photolithographic process comprises forming a first photoresist layer over said first insulating layer; exposing said first photoresist layer by shining light through said first optical mask, developing said first photoresist layer forming a first photoresist pattern having a first photoresist opening; etching said first insulating layer using said first photoresist pattern as an etch mask thus forming said first opening in said first insulating layer exposing said source region; and said second photolithographic process comprises forming a second photoresist layer over said dielectric layer; exposing said second photoresist layer using said first optical mask, the exposure of said second photoresist layer having a higher energy than the exposure of said first photoresist layer; developing said second photoresist layer forming a second photoresist pattern having an second photoresist opening; etching said dielectric layer using said second photoresist pattern as an etch mask and forming said second opening in said dielectric layer wherein said etch exposes said polysilicon stud; said second opening defined by the sidewalls of said dielectric layer; said second opening having a larger open dimension than said first opening.

4. The method of claim 1 wherein the thickness of said first polysilicon layer is between about 1000 and 3000 angstroms.

5. The method of claim 1 wherein said dielectric layer has a thickness in a range of between about 3000 and 8000 Å; said dielectric layeris composed of a material selected from the group consisting of phosphosilicate glass, borosilicate glass (BSG), doped spin-on-glass, thermal $O_3$-TEOS oxide, and borophosphosilicate glass.

6. The method of claim 1 wherein said planarizing layer formed of a material selected from the group consisting of LPCVD undoped oxide, and PECVD undoped oxide, and has a thickness in a range of between about 3000 and 8000 Å.

7. The method of claim 1 wherein said capacitor dielectric layer is composed of a top silicon oxide and silicon nitride and bottom silicon oxide (ONO) and the thickness of the bottom oxide is between about 30 to 90 Å and the thickness of the silicon nitride is between about 30 to 90 Å and the thickness of the top oxide is between about 30 to 90 Å.

8. The method of claim 1 wherein the thickness of said top electrode layer is between about 500 and 2000 Å.

9. A method of fabricating a dynamic random access memory device including a high capacitance stacked capacitor on a semiconductor substrate having a field oxide region, a device region, a gate structure formed in the device region, an interconnection line formed over said field oxide region, and source/drain regions associated with the gate structure, a first insulating layer over portions of the device and field oxide region, an opening in the first insulating layer over source/drain regions where electrical contact is desired to the stacked capacitor, the method comprising:

forming a planarizing layer over said first insulating layer;

using a photolithographic process to form a first opening in said first insulating layer and said planarizing layer and exposing said source region; said first opening formed using a photolithographic process using a first optical mask having first optical openings; said photolithographic process comprising forming a first photoresist layer over said first insulating layer; exposing said first photoresist layer using said first optical mask, developing said first photoresist layer forming a first photoresist pattern having a first photoresist openings; etching said first insulating layer using said first photoresist pattern as an etch mask and forming said first opening in said first insulating layer exposing said source region;

depositing a first polysilicon layer over said a planarizing layer; said first polysilicon layer filling said first opening and contacting said source region;

planarizing said first polysilicon layer forming a polysilicon stud in said first opening; said planarization performed using a process selected from the group consisting of chemical-mechanical polishing and etching back;

forming a dielectric layer over said planarizing layer;

forming a second opening in said dielectric layer using a photolithographic process using said first optical mask; said photolithographic process comprising forming a second photoresist layer over said dielectric layer; exposing said second photoresist layer using said first optical mask; the exposure of said second photoresist layer having a higher energy than the exposure of said first photoresist layer; developing said second photoresist layer forming a second photoresist pattern having an second photoresist opening; etching said dielectric layer using said second photoresist pattern as an etch mask and forming said second opening in said dielectric layer wherein said etch exposes said polysilicon stud; said second opening defined by the sidewalls of said dielectric layer; said second opening having a larger open dimension than said first opening;

forming a second polysilicon layer over said dielectric layer, over said sidewalls of said dielectric layer, and over said polysilicon stud; said second polysilicon layer defining a gap in said second opening;

chemical-mechanical polishing said second polysilicon layer forming a cylindrical electrode; said polysilicon stud and said cylindrical electrodeforming a bottom electrode;

selectively removing said dielectric layer;

depositing a capacitor dielectric layer over the resulting surface;

patterning said capacitor dielectric layerso that portions remain covering at least the bottom electrode;

forming a top electrode over said capacitor dielectric layer; and forming passivation layers, metal lines, and contacts to complete the dynamic random access memory device.

10. The method of claim 9 wherein the thickness of said first polysilicon layer is between about 1000 and 3000 angstroms.

11. The method of claim 9 wherein said dielectric layer has a thickness in a range of between about 3000 and 8000 Å, said dielectric layer is composed of a material selected from the group consisting of phosphosilicate glass, borosilicate glass (BSG), doped spin-on-glass, thermal $O_3$-TEOS oxide, and borophosphosilicate glass.

12. The method of claim 9 wherein said planarizing layer formed of a material selected from the group consisting of LPCVD undoped oxide, and PECVD undoped oxide, and has a thickness in a range of between about 3000 and 8000 Å.

13. The method of claim 9 wherein the capacitor dielectric layer is composed of a top silicon oxide and silicon nitride and bottom silicon oxide (ONO) and the thickness of the bottom oxide is between about 30 to 90 Å and the thickness of the silicon nitride is between about 30 to 90 Å and the thickness of the top oxide is between about 30 to 90 Å.

14. The method of claim 9 wherein the thickness of the top electrode layer is between about 500 and 2000 Å.

* * * * *